(12) United States Patent
Liu et al.

(10) Patent No.: US 7,544,078 B1
(45) Date of Patent: Jun. 9, 2009

(54) SLANTWISE CONNECTING BASE

(75) Inventors: Wen-Jie Liu, Shanghai (CN); Tsai-kuie Cheng, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 12/069,785

(22) Filed: Feb. 13, 2008

(51) Int. Cl.
*H01R 13/64* (2006.01)

(52) U.S. Cl. .................. 439/248; 439/529; 439/929

(58) Field of Classification Search .......... 439/248, 439/929, 529, 67
See application file for complete search history.

(56) References Cited

U.S. PATENT DOCUMENTS 6,290,534 B1 * 9/2001 Sadler .................... 439/534
6,994,575 B1 * 2/2006 Clark et al. ............. 439/173
2008/0057764 A1 * 3/2008 Kuo ...................... 439/248

* cited by examiner

*Primary Examiner*—Tho D Ta
(74) *Attorney, Agent, or Firm*—Peter F. Corless; Steven M. Jensen; Edwards Angell Palmer & Dodge LLP

(57) ABSTRACT

The present invention provides a slantwise connecting base for being connected to a control box having a first connection port. The slantwise connecting base includes a baseplate, a first circuit board and a second circuit board fixed to the baseplate. The baseplate has at least a slanting platform disposed thereon at a slant angle, and the slanting platform is used for disposing the first circuit board to be thereon. Moreover, the first circuit board has a second connection port corresponding to the first connection port, and the second connection port is used for being electrically connected to the control box. The second circuit board has an electrical connection portion for being electrically connected to the first circuit board, thereby allowing the second circuit board and the second connection port to be electrically connected to each other. Thus, the slantwise connecting base provides a means for the control box to be slantwise plugged therein.

10 Claims, 3 Drawing Sheets

SLANTWISE CONNECTING BASE

BACKGROUND OF THE INVENTION

1. Field of the Invention

The present invention generally relates to a slantwise connecting base, and more particularly, to a slantwise connecting base for being connected to a control box.

2. Description of Related Art

Common electronic devices, such as computers, television sets, audio players and liquid crystal displays, each has a host. When the host operates, signal transmission between the host and other external devices must be processed. Generally, the external devices are welded to the host via conductive wires, and this is very inconvenient while moving and arranging the electronic device and its external devices. Therefore, a traditional approach is to dispose a connecting base at end of the conductive wires, so that the external devices may be electrically connected to the host by means of plug-in connections. Consequently, the host and the external devices are able to plug into/unplug from each other for carrying or moving one of them with convenience.

Therefore, conventional connecting bases each have a hole on its casing to allow the host to plug into and to be electrically connected to. However, when a connector of the host is plugged into a connector of the connecting base, the former is usually plugged into the latter perpendicularly. Although the host is fixed to the connecting base firmly, the combined force of plug-in force and gravity apply directly on a circuit board in the connecting base. Therefore, the circuit board, which is the important component with the highest cost, is likely to be damaged after a long period of usage. For consumers, the damage undoubtedly increases the maintenance cost. Moreover, since the connecting base lacks necessary auxiliary support or protection, the connecting base and/or the host are easily to be damaged if hit by an external force when a host with a heavier weight is perpendicularly disposed on the connecting base.

Furthermore, a force may only be applied perpendicularly when the host is unplugged, thereby causing difficulty in unplugging. Also, if the force is applied in a wrong direction, the connecting base and/or the host are likely to be damaged, thereby causing poor connection, or even worse, broken wires. This consequently leads to the damaged connecting base and waste of money.

In an attempt to solve the above-mentioned problem by slantwise plugging the host into the connecting base, the connector must be welded in the connecting base at a slant angle. Thus, the cost is increased and the slant angle of the connector is unlikely to be well controlled and maintained, thereby causing the through hole of the connecting base not to slant effectively and correspondingly. Hence, the host is incapable of being stably plugged therein. In addition, although a new connector can be designed to provide the host and the connecting base with a connector for slantwise connection to each other, it requires new molds for manufacturing connectors. Since there is a great amount of molds required for manufacturing connectors, the exceedingly high costs of the new molds are obviously disadvantageous.

If a circuit board in the conventional connecting base is slantwise fixed to the casing of the connecting base to overcome the above-mentioned problems, all connection ports disposed on the circuit board must be relocated accordingly. This approach will cause all of the connection ports unable to align with the position of the corresponding openings on the casing the connecting base, resulting in the connecting base unable to be installed for use. In addition, if the position of the hole on the casing of connecting base is further shifted to align with each of the connection ports on the circuit board, the appearance of the connecting base is erratic and some connection ports even cannot be used. For instance, if circuit board is slantwise fixed to the casing in a way that the circuit board has a higher front end and a lower back end relative to the casing, the connection ports at the front end are disposed slantwise upward and the connection ports at the back end are disposed slantwise downward. Although the connection ports disposed slantwise upward have a very erratic appearance, they are nevertheless applicable. On the contrary, the connection ports disposed slantingly downward are inapplicable. If the connecting base is placed on a table, the connection ports disposed slantwise downward almost touch the table, and cannot work.

Accordingly, it is a highly urgent issue in the industry to provide a slantwise connecting base to effectively solve the above-mentioned drawbacks of the prior art

SUMMARY OF THE INVENTION

In light of the shortcomings of the above prior arts, it is an object of the present invention to provide a slantwise connecting base for avoiding damages by electrical connections.

It is another object of the present invention to provide an slantwise connecting base for control boxes to be conveniently plugged/unplugged.

It is a further object of the present invention to provide an slantwise connecting base for saving cost.

To achieve the above-mentioned and other objects, the present invention provides an slantwise connecting base for being connected to a control box having a first connection port. The slantwise connecting base includes a baseplate having at least a slanting platform disposed thereon at a slant angle; a first circuit board disposed on the slanting platform and having a second connection port corresponding to the first connection port for being electrically connected to the control box; and a second circuit board fixed on the baseplate and having an electrical connection portion electrically connected to the first circuit board, so that the second circuit board and the second connection port are electrically connected to each other.

In the above-mentioned slantwise connecting base, the slanting platform provides a slanting surface. For example, the cross section of the slanting platform may be either a triangle structure or a trapezoid structure. Certainly, the slanting platform may be other designs of the slanting plane without specific limitations. The first circuit board may be fixed onto top surface of the slanting platform and the second connection port is perpendicularly disposed on the first circuit board, so that the second connection port is slant relatively to the baseplate. The electrical connection portion may be either a flexible bus or a flexible circuit board. Moreover, the second circuit board may further include an opening corresponding to the slanting platform, thereby allowing the slanting platform to protrude from the opening of the second circuit board. Preferably, the second circuit board has a plurality of sockets on its periphery, and the opening is correspondingly surrounded by each of the sockets.

In addition, the above-mentioned slantwise connecting base further includes a casing fixed to the baseplate for covering the second circuit board and the slanting platform. A through hole is disposed on the top portion of the casing for exposing the second connection port. Preferably, the top portion of the casing have a plug-in slot thereon, and the through hole is in the bottom portion of the plug-in slot, in which the plug-in slot is aligned with the second connection port and is perpendicular to the first circuit board.

In view of the above, in the slantwise connecting base of the present invention, a slanting platform is disposed on the baseplate, and a first circuit board electrically connected to a control box is disposed on the slanting platform. Also, the first circuit board has a second connection port for being electrically connected to the first connection port of the control box, so that the control box is electrically connected to the slantwise connecting base slantwise. By using the design, the control box is plugged into the slantwise connecting base at a slant angle rather than in perpendicular direction. Hence, the control box is conveniently plugged into/unplugged from the slantwise connecting base. Therefore, neither the control box nor the slantwise connecting base is likely to be damaged during plugging/unplugging. As a result, poor connection and broken lines are unlikely to occur. If poor connection or broken lines occur, only the first circuit board needs to be replaced instead of the entire set of the slantwise connecting base, thereby saving cost. Moreover, no additional molding process is required for manufacturing the second connection port, thereby also saving cost.

Further, the control box is slantwise plugged. This not only allows the control box to be fixed firmly to the slantwise connecting base, but also disperses the working force in various directions to reduce the force applied on the slanting platform, resulting in avoiding damages to the connection ports.

DETAILED DESCRIPTION OF PREFERRED EMBODIMENTS

The following preferred embodiments are provided to illustrate the disclosure of the present invention, and these and other advantages and effects may be easily conceived by persons skilled in the art from the disclosure of this specification.

Figure 1:
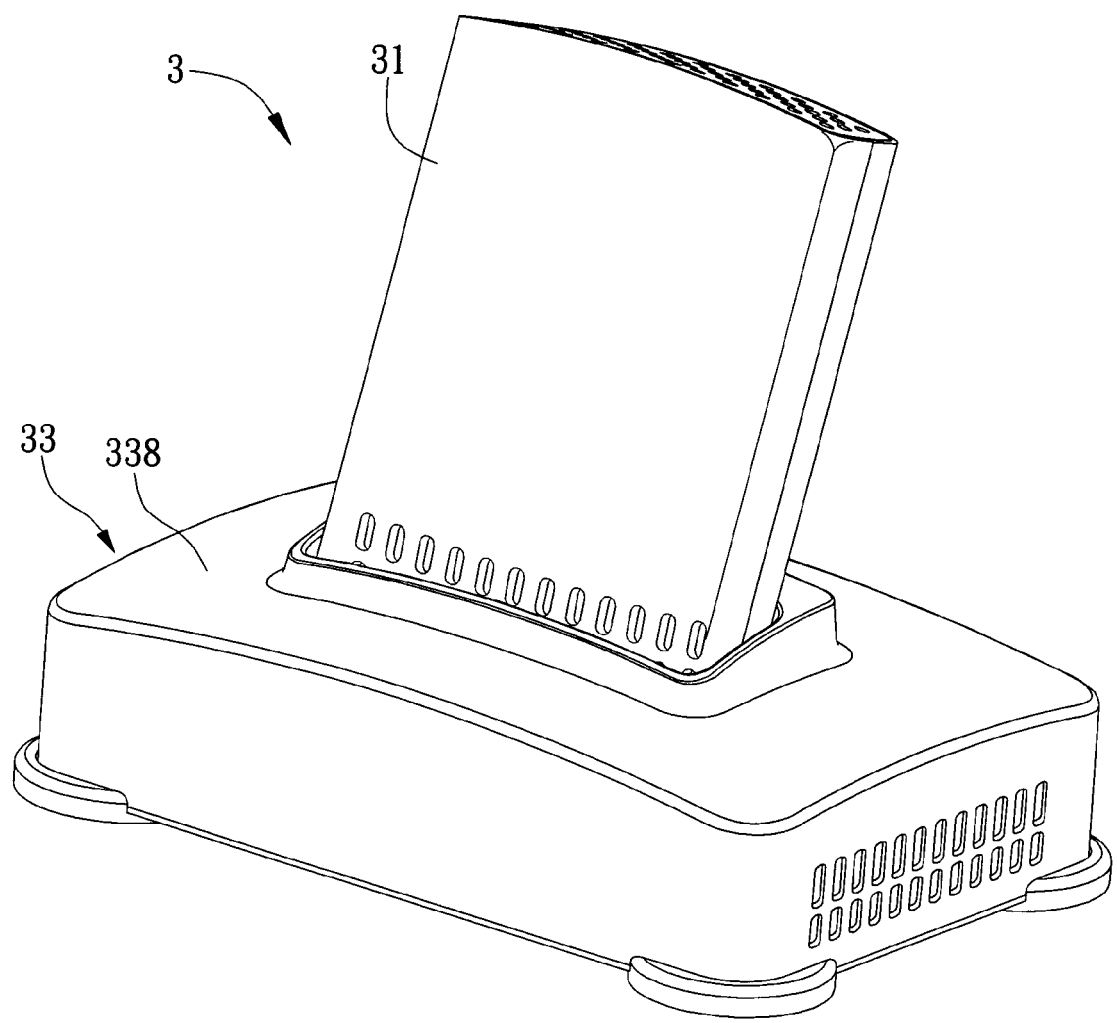
FIG. 1 is a diagram showing the slantwise connecting base and a control box according to the present invention.
Figure 2:
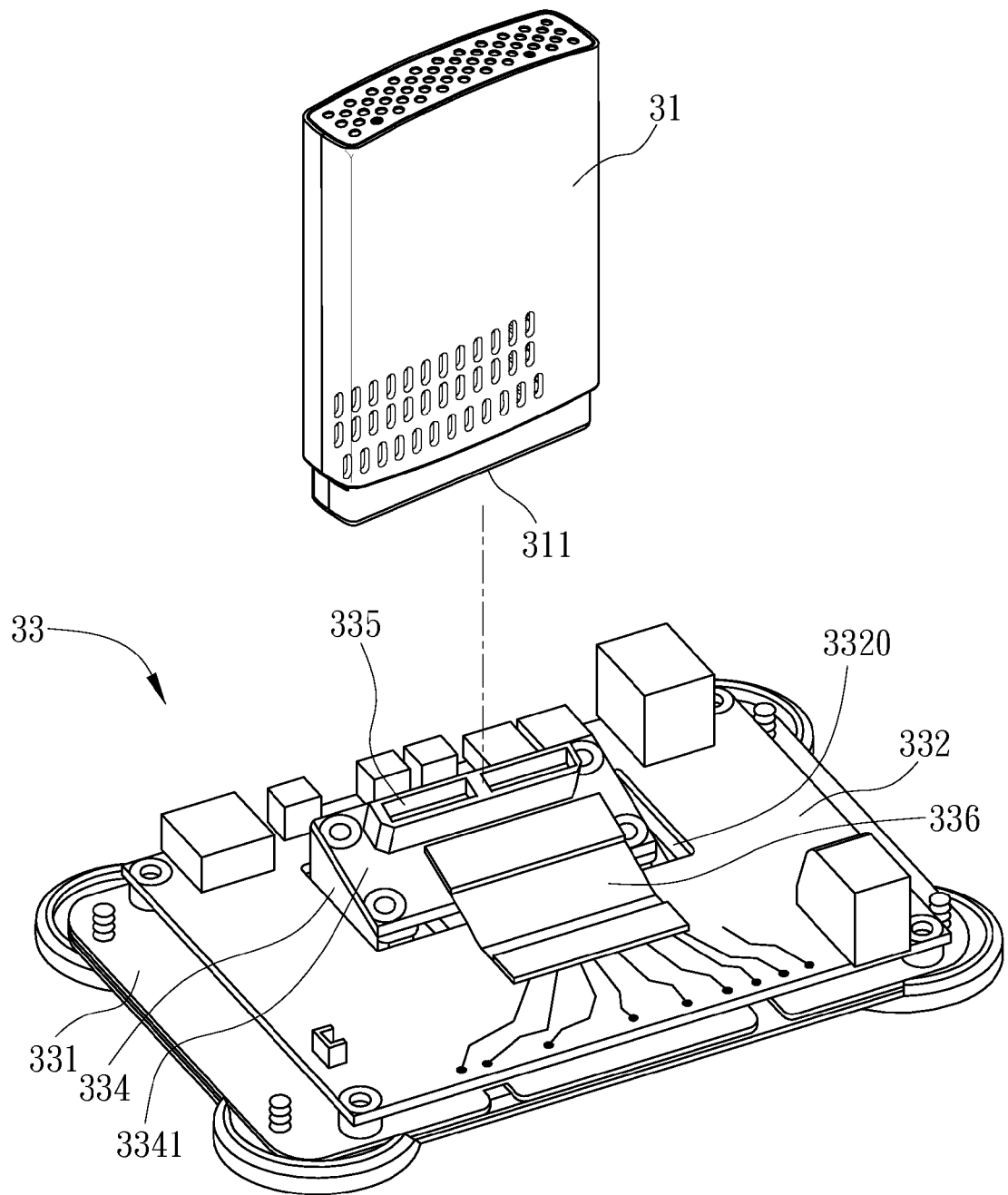
FIG. 2 is a diagram showing components of the slantwise connecting base and control box according to the present invention.

Referring to FIGS. 1 and 2, the present invention provides an slantwise connecting base 33. In the present embodiment, the slantwise connecting base 33 is applicable to a control box 31 having a first connection port 311 to be assembled into an audio/video equipment 3, which is applicable to a network video conference serving system. The slantwise connecting base 33 provides the control box 31 with electrical connection from a power source and expansion of signals. The slantwise connecting base 33 includes a baseplate 331 and a second circuit board 332. Also, the slantwise connecting base 33 includes a casing 338.

Although the slantwise connecting base 33 of the present invention is exemplified to, but not limited to, be applied in the audio/video equipment 3. The slantwise connecting base 33 of the present invention is used not only for the control box 31 having functions such as the video host function to be plugged into/unplugged from, but also for other external connection devices. Likewise, the application of the present invention is not limited to the above-mentioned control box 31.

The baseplate 331 has at least a slanting platform 334 disposed thereon at a slant angle, and the slanting platform 334 has a first circuit board 3341 disposed thereon. The first circuit board 3341 has a second connection port 335 corresponding to the first connection port 311. In the embodiment, the cross section of the slanting platform 331 is a trapezoid structure, but it is understood by persons having ordinary skills in the art that the slanting platform 334 is used for providing a slanting surface. Therefore, the shape of the slanting platform is not limited to the drawn structural shapes shown in the figure. For instance, the cross section of the slanting platform 334 may also be a triangle structure, and certainly, other shapes of the slanting platform 334 may also be designed. Moreover, the first circuit board 3341 is fixed onto the top surface of the slanting platform 334, and the second connection port 335 is perpendicularly disposed on the first circuit board 3341, thereby allowing the second connection port 335 to be slant relatively to the baseplate 331. Since the first connection port 311 of the control box 31 is plugged into the second connection port 335 correspondingly, the control box 31 is slantwise connected to the slantwise connecting base 33.

The second circuit board 332 is fixed to the baseplate 331 and has an electrical connection portion 336 and an opening 3320 corresponding to the slanting platform 334. The electrical connection portion 336 is electrically connected to the first circuit board 3341, thereby allowing the second circuit board 332 and the second connection port 335 to be electrically connected to each other. In the embodiment, the electrical connection portion 336 may be a flexible circuit board; while in other embodiments, the electrical connection portion 336 may be a flexible bus. The size of the opening 3320 is greater than or equal to size of the slanting platform 334, thereby allowing the slanting platform 334 to protrude from the opening 3320 of the second circuit board 332.

In addition, in order to provide the slantwise connecting base 33 with external expansion functions (such as external power sources, network servers, displays, speakers and microphones), a plurality of sockets (such as power sockets, network sockets, display sockets, audio sockets, video sockets and USB sockets) are disposed on the periphery of the second circuit board 332. Therefore, the opening 3320 is correspondingly surrounded by each of the external sockets. However, the amounts and the types of the external sockets are designed on basis of the practical needs of a specific product, and are not the technical features of the present invention. Thus, the external sockets in the embodiment are only symbolic schematic blocks, and not used to limit the structural designs of the slantwise connecting base 33.

In addition, the second circuit board 332 may be fixed to the baseplate 331 by using screws, wedging, glue, or thermal welding.

Figure 3:
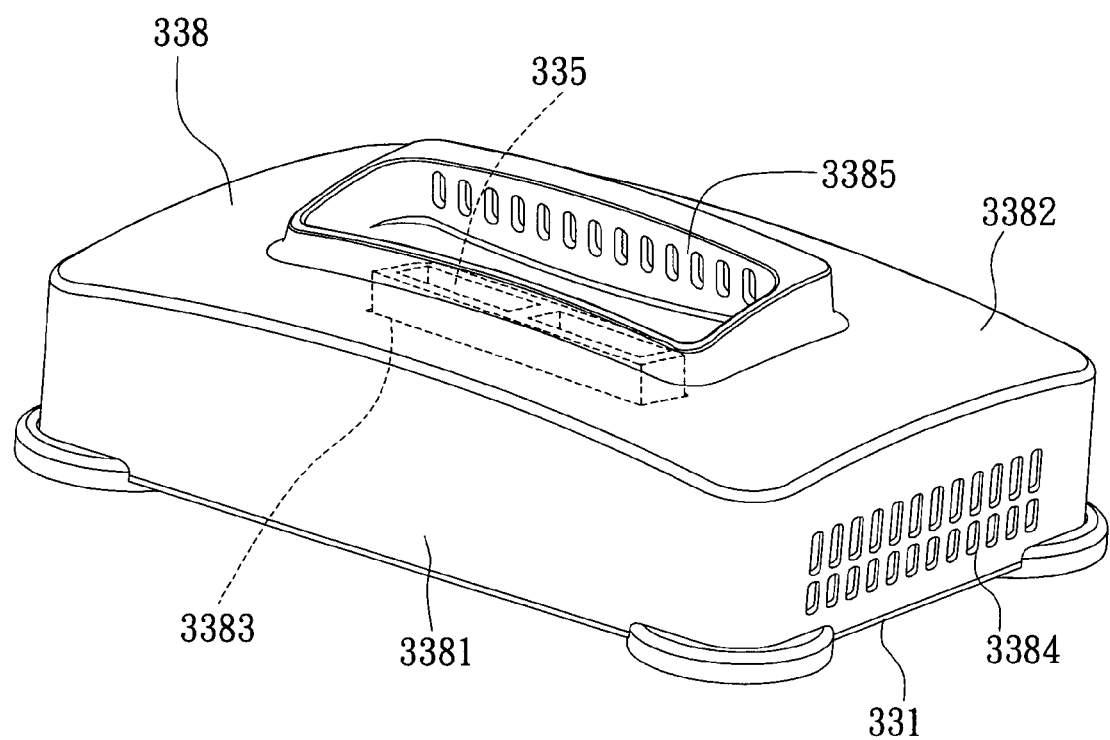
FIG. 3 is a diagram showing the slantwise connecting base according to the present invention.

Referring also to FIG. 3, in addition to the above-mentioned baseplate 331 and the second circuit board 332, the slantwise connecting base 33 further includes a casing 338 fixed to the baseplate 331. The casing 338 is fixed to the baseplate 331 to cover the second circuit board 332 and the slanting platform 334. In the embodiment, the casing 338 has sidewalls 3381, a top wall 3382 and a plurality of heat-dissipating holes 3384. The top wall 3382 has a through hole 3383 and a plug-in slot 3385. The plug-in slot 3385 is positioned at the same slant angle, and aligned with the aligning second connection port 335. The through hole 3383 is located at the bottom portion of the plug-in slot 3385, thereby allowing the first connection port 311 of the control box 31 to pass through the plug-in slot 3385 and the through hole 3383, so as to be slantwise connected to the second connection port 335.

Since the slanting platform 334 is disposed on the baseplate 331, the second connection port 335 of the slantwise connecting base 33 is fixed at the same slant angle. The existing second circuit board 332 and the newly added first circuit board 3341 are electrically connected to each other via the electrical connection portion 336, so that the second circuit board 332 to is electrically connected to the second connection port 335. This allows the control box 33 to be slantwise electrically connected to the slantwise connecting base 33.

The slantwise connecting base 33 allows the control box 31 to be in a slanting state, so that the overall weight of the control box 31 is divided into components of force due to the slanting state. In other words, the stress on the second connection port 335 is dispersed to the casing 338 via the plug-in slot 3385, to avoid damage to the first connection port 311 and the second connection port 335 due to a long period of local stress. Further, since the control box is connected to the slantwise connecting base at a slant angle, users can easily plug/unplug the control box 31 without damaging the slantwise connecting base even there is uneven force applied thereon. In addition, the slanting state of the control box 31 is advantageous for providing auxiliary support and protection, so that the external force does not damage the control box 31. When the second connection port 335 of the slantwise connecting base 33 is damaged, only the first circuit board 33, instead of the entire set of the slantwise connecting base 33, is replaced. This avoids unnecessary waste. Furthermore, the aesthetic appearance of the control box 31 connected to the slantwise connecting base 33 is enhanced.

In view of the above, in the slantwise connecting base of the present invention, a slanting platform is disposed on the baseplate, and a first circuit board is disposed thereon for being electrically connected to the control box. Also, the first circuit board has a second connection port for being electrically connected to the first connection port of the control box, thereby allowing the control box to be slantwise and electrically connected to the slantwise connecting base. The control box is plugged into the base at a slant angle, thereby achieving convenient plugging/unplugging. Since it is easy for users to plug/unplug, the control box and the slantwise connecting base are unlikely to be damaged. Therefore, situations such as poor connection and broken wires are unlikely to occur. Once poor connection or broken lines occur, only the first circuit board, instead of the whole set of slantwise connecting base, is replaced. This achieves the object of saving cost. Moreover, there is no need of additional molding process for the second connection port, thereby also saving cost.

The present invention has been described using exemplary preferred embodiments. However, it is to be understood that the scope of the present invention is not limited to the disclosed arrangements. The scope of the claims, therefore, should be accorded the broadest interpretation, so as to encompass all such modifications and similar arrangements.

What is claimed is:

1. A slantwise connecting base for being connected to a control box having a first connection port, the slantwise connecting base comprising:
   a baseplate having at least a slanting platform disposed thereon at a slant angle;
   a first circuit board disposed on the slanting platform, and having a second connection port corresponding to the first connection port and electrically connected to the control box; and
   a second circuit board fixed to the baseplate, and having an electrical connection portion electrically connected to the first circuit board, thereby allowing the second circuit board and the second connection port to be electrically connected to each other, wherein the second circuit board has an opening corresponding to the slanting platform, thereby allowing the slanting platform to protrude from the opening of the second circuit board.

2. The slantwise connecting base of claim 1, wherein a cross section of the slanting platform is a triangle structure or a trapezoid structure.

3. The slantwise connecting base of claim 1, wherein the second circuit board has a plurality of sockets disposed on periphery thereof, and the opening is correspondingly surrounded by each of the sockets.

4. The slantwise connecting base of claim 1, wherein the first circuit board is fixed onto a top surface of the slanting platform, and the second connection port is perpendicularly disposed on the first circuit board, thereby allowing the second connection port to be correspondingly slanting to the baseplate.

5. The slantwise connecting base of claim 1, wherein the electrical connection portion is a flexible circuit board.

6. The slantwise connecting base of claim 1, wherein the electrical connection portion is a flexible bus.

7. The slantwise connecting base of claim 1, further comprising a casing fixed to the baseplate for covering the second circuit board and the slanting platform.

8. The slantwise connecting base of claim 7, wherein the casing has a through hole disposed on a top portion thereof for exposing the second connection port.

9. The slantwise connecting base of claim 8, wherein the top portion of the casing has a plug-in slot for the control box to be plugged therein, and the through hole is disposed at a bottom portion of the plug-in slot.

10. The slantwise connecting base of claim 9, wherein the plug-in slot is aligned with the second connection port, and is perpendicular to the first circuit board.

* * * * *